United States Patent
Lo

(12) 
(10) Patent No.: US 6,272,014 B1
(45) Date of Patent: Aug. 7, 2001

(54) HEAT SINK DEVICE FOR A CHIP

(75) Inventor: Wei-Ta Lo, Tu-chen (TW)

(73) Assignee: Foxconn Precison Components Co., Ltd., Taipei (TW)

( * ) Notice: Subject to any disclaimer, the term of this patent is extended or adjusted under 35 U.S.C. 154(b) by 0 days.

(21) Appl. No.: 09/439,115

(22) Filed: Nov. 12, 1999

(30) Foreign Application Priority Data

Jul. 16, 1999 (TW) ................................................. 88211986

(51) Int. Cl.[7] ...................................................... H05K 7/20
(52) U.S. Cl. ............................................................ 361/704
(58) Field of Search ............................. 24/458; 165/80.2, 165/80.3, 185; 174/16.3; 257/706–707, 712–713, 718–719, 726–727; 361/704, 707, 709–710, 715, 719–720

(56) References Cited

U.S. PATENT DOCUMENTS

| | | | |
|---|---|---|---|
| 5,730,210 | * 3/1998 | Kou | 257/719 |
| 5,999,402 | * 12/1999 | Jeffries et al. | 361/687 |
| 6,112,378 | * 9/2000 | Lee | 257/718 |

* cited by examiner

Primary Examiner—Gregory Thompson
(74) Attorney, Agent, or Firm—Wei Te Chung

(57) ABSTRACT

A heat sink device for a chip comprises a heat sink, a pair of mounting portions and a pair of fixing bolts. The heat sink includes a base, a plurality of fins and a pair of tabs symmetrically extending from opposite corners thereof and having a hole. Each mounting portion includes a main body, a resilient arm upwardly and inwardly extending from an end of the main body and a pair of clamping portions extending from the edges of the main body. Apertures defined in the main bodies and openings defined in the resilient arms correspond to the holes of the tabs. Each fixing bolt includes a cap, a beam, a latch and a step.

13 Claims, 5 Drawing Sheets

HEAT SINK DEVICE FOR A CHIP

BACKGROUND OF THE INVENTION

The present invention relates to a heat sink device and, more particularly, to a heat sink device used on a chip.

Recent developments in the computer industry have resulted in an increase in the speed of electronic chips accompanied by a sharp increase in heat generated by the chip. A heat dissipation method is a necessity. A heat sink device mounted on the chip is one method used to cool a chip and to assure normal chip operation.

A conventional heat sink device as disclosed in U.S. Pat. No. 5,384,940 is shown in FIG. 5. The heat sink device 2 comprises a heat sink 110, a pair of fixing bolts 120 and a pair of springs 130. The heat sink 110 includes a base and a plurality of fins upwardly depending therefrom, the base defining holes for receiving the fixing bolts 120. Each fixing bolt 120 includes a cap 122, a beam 124 and a latch 126. The diameter of each beam 124 corresponds to the diameter of each hole (not shown) in the heat sink 110 and is smaller than the diameter of each cap 122 and each latch 126 respectively. The springs 130 encircle the beams 124 of the fixing bolts 120. During assembly, the fixing bolts 120 protrude though the corresponding holes (not shown) of the heat sink 110 and the printed circuit board (not shown). The latches 126 press against the bottom surface of the printed circuit board. The heat sink 110 presses against the chip with a resilient force, which resilient force is provided by the springs 130. However, the limited resilient force provided by the springs 130 can not meet the requirements for tightly attaching the heat sink 110 to the chip. Moreover, the fixing bolts 120 are mounted between the closely arrayed fins, making installation inconvenient. U.S. Pat. No. 5,943,210 having the same assignee with the invention also discloses another type heat sink device for use with the CPU.

BRIEF SUMMARY OF THE INVENTION

A main object of the present invention is to provide a heat sink device used to cool a chip.

Another object of the present invention is to provide a heat sink device which is more convenient to install and which provides a greater resilient force for pressing against an electronic chip.

A heat sink device of the present invention comprises a heat sink, a pair of mounting portions and a pair of fixing bolts. The heat sink comprises a base forming a plurality of fins and a pair of tabs extending from opposite corners of the base. Each tab has a circular hole. Each mounting portion is unitarily formed and includes a main body, a resilient arm upwardly and inwardly extending from an end of the main body and a pair of clamping portions depending from opposite edges of the main body. The mounting portions are respectively secured to each tab, the main bodies being attached to the tabs. A circular aperture is defined in each main body, while an oval opening is defined in each resilient arm. Each fixing bolt includes a cap, a beam and a latch.

In assembly, each heat sink is attached against a chip on a printed circuit board by means of the fixing bolts attaching the heat sink and mounting portions to the printed circuit board, the resilient arms of the mounting portions providing a resilient force pressing the heat sink to the chip.

Other objects, advantages and novel features of the invention will become more apparent from the following detailed description when taken in conjunction with the accompanying drawings.

DETAILED DESCRIPTION OF THE INVENTION

Figure 1:
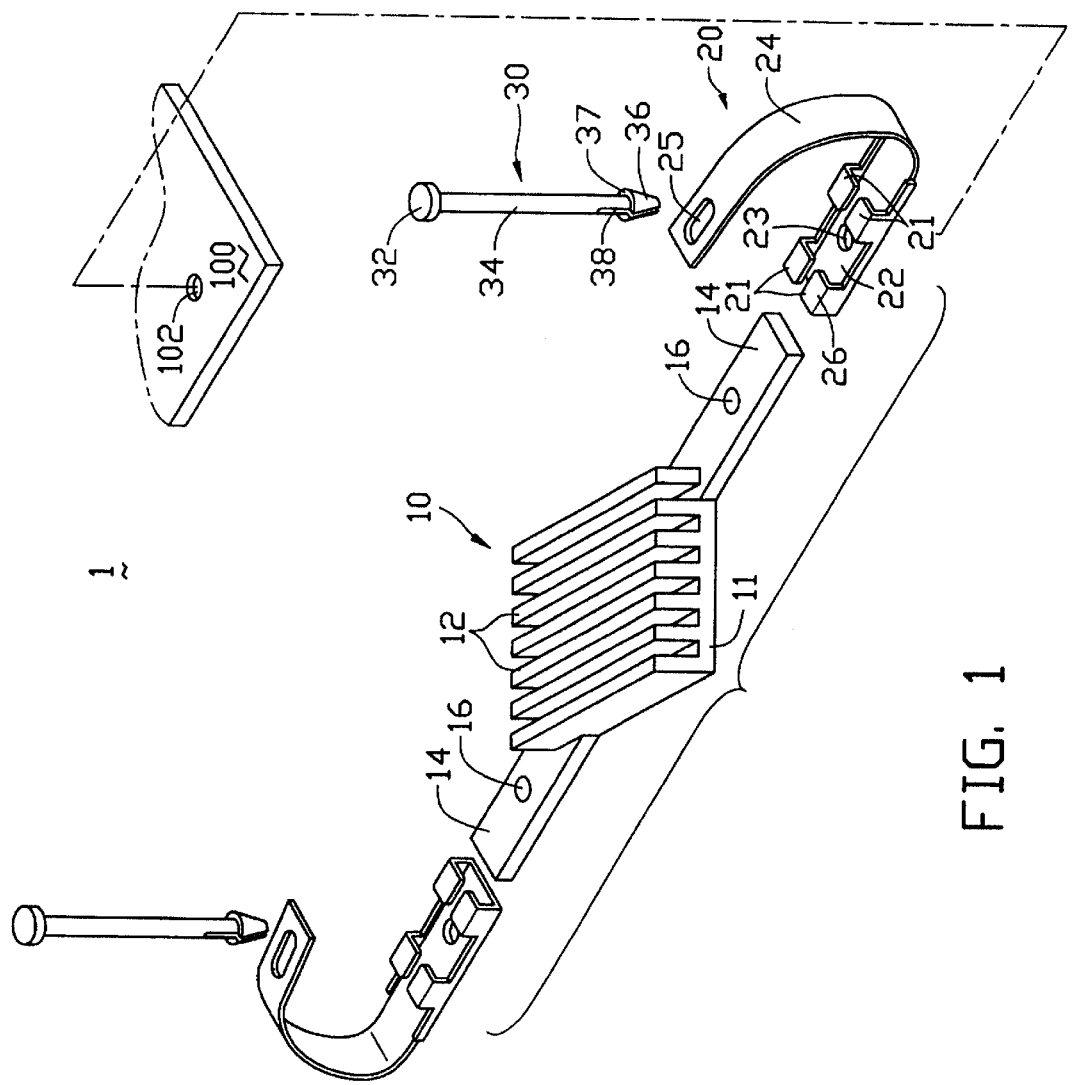
FIG. 1 is an exploded view of a heat sink device in accordance with the present invention.

Referring to FIG. 1, a heat sink device 1 according to the present invention comprises a heat sink 10, a pair of mounting portions 20 and a pair of fixing bolts 30. The heat sink 10 includes a base 11 forming a plurality of fins 12 and a pair of tabs 14 extending from the opposite corners of the base 11. Each tab defines a circular hole 16.

Each mounting portion 20 is unitarily formed by stamping a metal sheet and includes a main body 22, a resilient arm 24 and restraint means, i.e., a pair of clamping portions 21. The resilient arm 24 upwardly and inwardly extends from an end of the main body 22. The clamping portions 21 depend from opposite edges of the main body 22. Each clamping portion 21 comprises a pair of L-shaped claws 26 for enclosing a corresponding tab 14 of the heat sink 10, to secure the main body 22 to the heat sink 10. Each main body 22 defines a circular aperture 23 and each resilient arm 24 defines an oval opening 25. In assembly, the aperture 23 and opening 25 are respectively in alignment with the hole 16 of the tab 14.

Each fixing bolt 30 includes a cap 32, a latch 36 and a beam 34 between the cap 32 and the latch 36. Each latch 36 is in the shape of an inverted cone and is bisected by a channel 38, which is provided for resilient distortion of the latch 36. The base of the cone-shaped latch forms a step 37, where the latch 36 joins the beam 34. The diameter of the beam 34 corresponds to the diameters of the holes 16 in the tabs 14 and the diameters of the apertures 23 and the widths of the openings 25 in the mounting portions 20.

A pair of through holes 102 is defined in a printed circuit board 100 proximate two opposite corners of a chip mounted thereon. The through holes correspond in size to the beams 34 of the fixing bolts 30.

Figure 2:
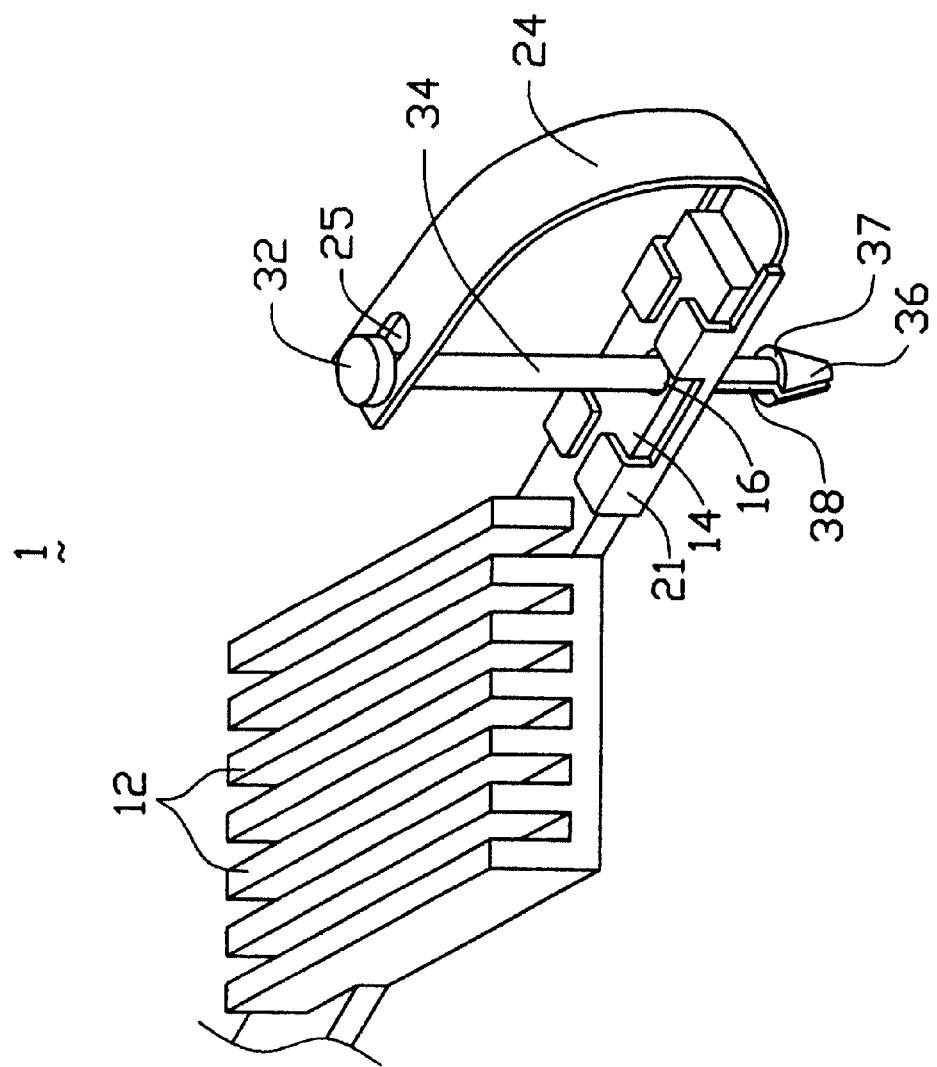
FIG. 2 is an assembled view of FIG. 1.

Referring to FIG. 2, in assembly, the clamping portions 21 of the mounting portions 20 receive the tabs 14 of the heat sink 10, and the apertures 23 of the mounting portions 20 coincide with the holes 16 of the tabs 14. The fixing bolts 30 are sequentially inserted into the openings 25 of the mounting portions 20, the holes 16 of the heat sink 10 and the apertures 23 of the mounting portions 20.

The latches 36 of the fixing bolts 30 are then inserted into the through holes defined in the printed circuit board 100. The steps 37 of the fixing bolts 30 abut against a bottom surface of the printed circuit board. The resilient force attained by stretch distortion of the resilient arms 24 enables the heat sink 10 to be tightly attached to a chip (not shown) mounted on the printed circuit board. The oval openings 25 of the resilient arms 24 provide spaces for movement of the beams 34 to properly adjust the relative position between the resilient arms 24 and the beams 34.

The mounting portions 20 and the fixing bolts 30 of the present invention are not mounted among the fins 12 of the heat sink 10, so no special tools are required for assembly, and the heat sink device is more convenient to install than the prior art heat sink device. Furthermore, the mounting portions are made from metal sheets of a selectable material and thickness and are designed for specific resilient characteristics to meet different requirements.

Figure 3:
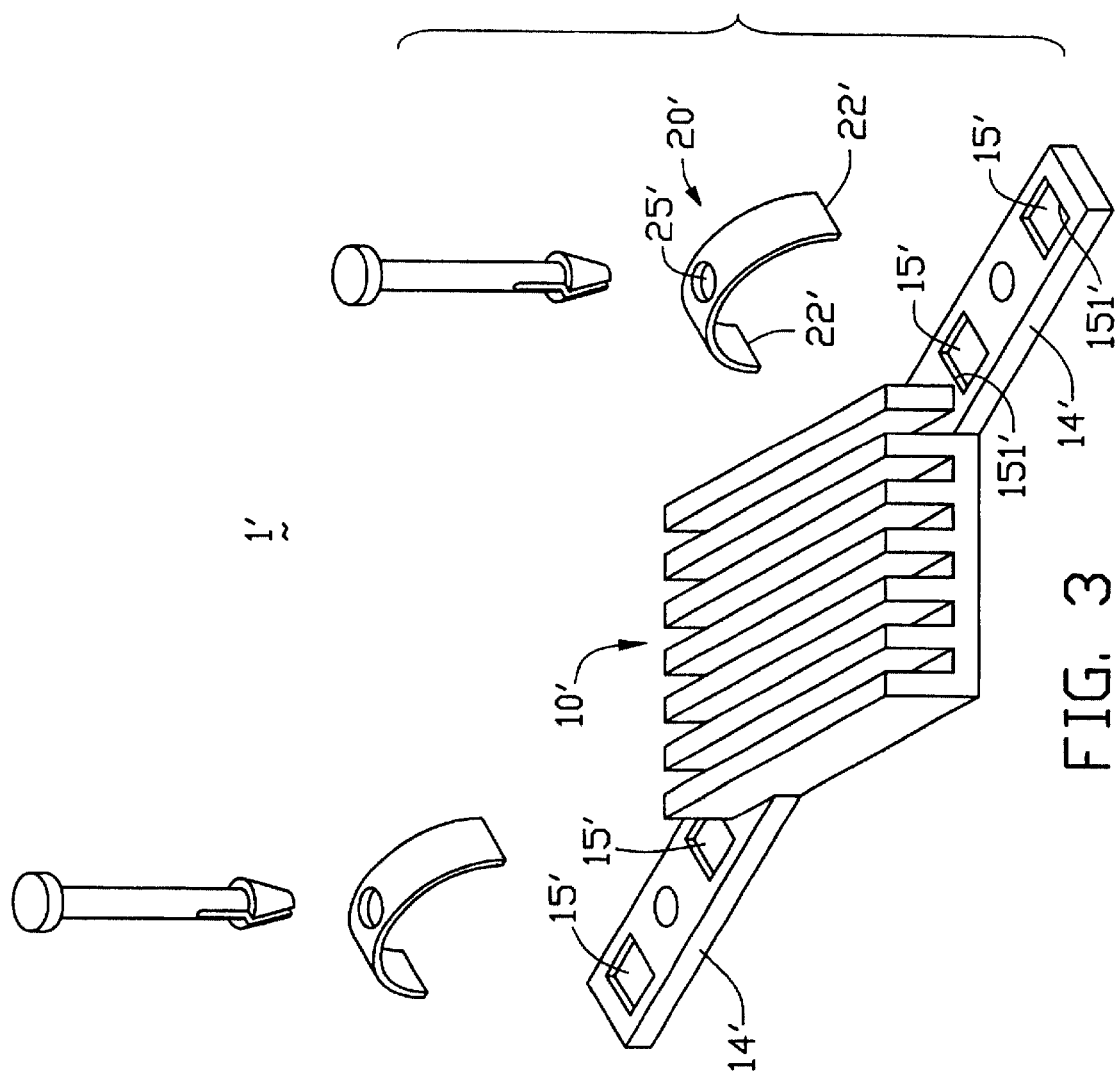
FIG. 3 is an exploded view of a heat sink device of another embodiment of the present invention.
Figure 4:
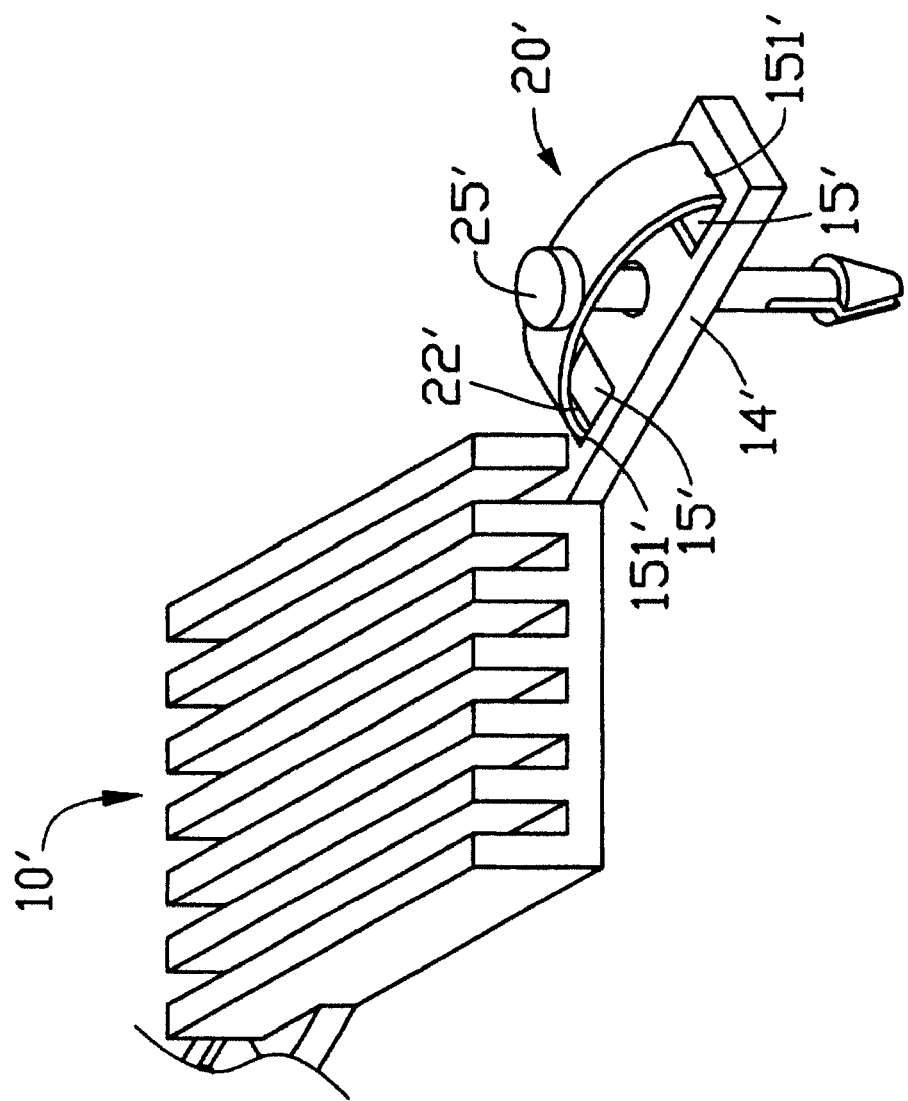
FIG. 4 is an assembled view of FIG. 2.
Figure 5:
FIG. 5 is a side view of a conventional heat sink device.

A heat sink device of a second embodiment of the present invention is illustrated in FIGS. 3 and 4. The arcuate mounting portions 20' each include a circular opening 25' at a middle thereof and are formed by stamping and bending metal sheets. A pair of recesses 15' are defined on each tab 14' of the heat sink 10' corresponding to a pair of edge sections 22' of the mounting portions 20'. The edge sections 22' are slidably received in the recesses 15'. Movement of the edge sections 22' in the recesses 15' is limited by opposite inner walls 151' of the recesses 15' to avoid disengagement of the mounting portions 20' from the tabs 14'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink device for placing on a board-mounted electronic element, comprising:

a heat sink including a base, a plurality of fins extending upward from the base, and a pair of tabs extending from opposite corners of the base, each tab defining a hole;

a pair of mounting elements each being at least partially resilient forbeing adjustably mounted to a respective tab of the heat sink, each mounting element including an arcuate portion and an opening aligned with the hole of each tab; and a pair of fixing bolts each inserted through the opening of each mounting element, the hole of each tab and a hole of a printed circuit board, each fixing bolt including a cap for pressing against a top of the mounting element and a latchadapted for abutting against a bottom of the printed circuit board, thereby resiliently compressing each mounting element to exert a downward force to each tab of the heat sink.

2. The heat sink device as claimed in claim 1, wherein each mounting element includes a main body and a pair of clamping portions, and wherein the arcuate portion is formed as a resilient arm.

3. The heat sink device as claimed in claim 2, wherein the pair of clamping portions unitarily depends from opposite edges of the main body, each clamping portion having a pair of L-shaped claws for enclosing each tab of the heat sink and securing each said clamping portion to the heat sink.

4. The heat sink device as claimed in claim 2, wherein an aperture is defined in the main body of each mounting element and is in alignment with the opening of each mounting element.

5. The heat sink device as claimed in claim 2, wherein the resilient arm extends from an end of each main body of the mounting element, the opening of each mounting element is defined adjacent to an end of the resilient arm and is oval in shape for providing space for movement of the beam of each fixing bolt.

6. The heat sink device as claimed in claim 1, wherein each tab of the heat sink defines a pair of recesses for receiving a pair of edges of each mounting element.

7. The heat sink device as claimed in claim 1, wherein the latch of each fixing bolt is in the shape of an inverted cone and defines a channel in a middle thereof.

8. The heat sink device as claimed in claim 1, wherein each fixing bolt has a step at a top end of the latch and a beam, and wherein the step is wider than the beam.

9. A heat sink device comprising:

a heat sink including a base with a plurality of fins upwardly extending therefrom, a pair of tabs extending from the base and each having a through hole;

a pair of resilient mounting elements each attached to a corresponding tab, said mounting element having a hole in an upper portion thereof and a restraint means on a lower portion thereof; and a pair of fixing bolts each including an elongate beam with a cap at a top portion thereof and a latch at a bottom portion thererof; wherein said beam extends through the hole of each mounting element with the cap abutting against the upper portion of the mounting element and through the through hole of the heat sink with said restraint means retaining to the tab to assemble said mounting element to the tab.

10. The heat sink device as claimed in claim 9, wherein said restrain means of each mounting element includes a pair of clamping portion retainably receiving the corresponding tab therein.

11. The heat sink device as claimed in claim 9, wherein an aperture is defined in the lower portion of each mounting element through which the beam of the fixing bolt extends.

12. The heat sink device as claimed in claim 9, wherein said restraint means includes a pair of edge sections.

13. The heat sink device as claimed in claim 12, wherein a pair of recesses are formed in each tab on opposite sides of the hole for receivably limiting sliding movement of the corresponding edge section therein.

* * * * *